United States Patent
Blouke et al.

(10) Patent No.: US 6,329,219 B1
(45) Date of Patent: Dec. 11, 2001

(54) METHOD OF PROCESSING A SEMICONDUCTOR DEVICE

(75) Inventors: Morley M. Blouke, Portland; Brian L. Corrie, Gaston, both of OR (US)

(73) Assignee: Scientific Imaging Technologies, Inc., Tigard, OR (US)

( * ) Notice: Subject to any disclaimer, the term of this patent is extended or adjusted under 35 U.S.C. 154(b) by 0 days.

(21) Appl. No.: 09/644,249

(22) Filed: Aug. 22, 2000

Related U.S. Application Data

(60) Provisional application No. 60/171,848, filed on Dec. 22, 1999.

(51) Int. Cl.⁷ .................................................. H01L 21/00
(52) U.S. Cl. ............................................... 438/60; 257/215
(58) Field of Search .................. 438/60, 75–79, 438/144–148; 257/215

(56) References Cited

U.S. PATENT DOCUMENTS

| | | | |
|---|---|---|---|
| 4,077,112 | * | 3/1978 | Theunissen et al. .................... 29/580 |
| 4,559,695 | * | 12/1985 | Baker ...................... 29/572 |
| 4,648,175 | * | 3/1987 | Metz, Jr. et al. ...................... 29/589 |
| 4,831,425 | * | 5/1989 | Pals et al. .............................. 357/24 |
| 4,903,098 | * | 2/1990 | Smit et al. ............................ 357/24 |

* cited by examiner

*Primary Examiner*—David Nelms
*Assistant Examiner*—David Vu
(74) *Attorney, Agent, or Firm*—John Smith-Hill; Smith-Hill and Bedell

(57) ABSTRACT

A semiconductor device, such as a back side illuminated CCD, is fabricated by forming an insulating layer over the front side of a body of semiconductor material, depositing a layer of high resistivity material over the front side of the insulating layer, patterning a portion of the layer of high resistivity material to form a long and narrow trace, and attaching a support member to the front side of the insulating layer. In the case of a back side illuminated CCD, the patterning of the layer of high resistivity material advantageously forms a long and narrow trace substantially confined to a peripheral area of the front side of the insulating layer and the semiconductor material is removed from the corresponding peripheral area of the back side of the insulating layer, leaving a plateau of semiconductor material that does not extend over the area that contains the long and narrow trace.

14 Claims, 6 Drawing Sheets

50

METHOD OF PROCESSING A SEMICONDUCTOR DEVICE

CROSS-REFERENCE TO RELATED APPLICATION

This application claims benefit of Provisional Application No. 60/171,848 filed Dec. 22, 1999. The entire disclosure of Provisional Application No. 60/171,848 is hereby incorporated by reference herein.

BACKGROUND OF THE INVENTION

This invention relates to a method of processing a semiconductor device and in particular to a method for processing a semiconductor device to provide an integrated circuit that includes a functional resistor. Although some aspects of this invention may be applied to semiconductor devices other than charge-coupled devices (CCDs), certain aspects of the invention are particularly useful when applied to a CCD and therefore the invention will be described in the context of a CCD. Further, it will be understood by those skilled in the art that there are many different types of CCDs and those skilled in the art will understand that the invention described herein, even as applied to a CCD, is not limited in application to a specific type of CCD. Therefore, it should not be inferred from the fact that the invention is described with reference to a back-side illuminated, n-channel three-phase device that the invention is limited in application to a CCD, or that the invention, even as applied to a CCD, is limited to this specific type of CCD.

A charge-coupled device (CCD) may be made by processing a silicon die of p conductivity using conventional MOS technology to form a buried channel of n conductivity in an active region beneath the front or circuit side of the die (the side through which the die is processed). The channel is resolved into a linear array of like elementary zones by a clocking electrode structure which is composed of gate electrodes and overlies the circuit side of the die, and by application of selected potentials to the gate electrodes, a charge packet present in a given elementary zone of the channel may be advanced through the linear array of elementary zones, in the manner of a shift register, and discharged from the channel. In a multi-phase CCD, the gate electrodes are organized as multiple sets and different phases of a multi-phase clock signal are applied to the respective sets of gate electrodes.

Charge may be generated in the channel photoelectrically. Thus, if electromagnetic radiation enters the buried channel, it may cause generation of conduction electrons, and these conduction electrons may be confined in one of the elementary zones to form a charge packet.

A CCD may be used to generate an electrical signal representative of the distribution of light intensity over the active region of the CCD. In such an imaging CCD, there may be multiple imaging channels extending parallel to one another and each connected at one end to a common readout channel which extends perpendicular to the imaging channels. Charge packets are generated in the elementary zones or pixels of the imaging channels during an integration interval. Subsequently, during a readout interval, the charge packets are transferred from the imaging channels into the readout channel and the charge packets are transferred serially through the readout channel and deposited in an N+ floating diffusion. The size of a charge packet is measured by using a charge-sensing amplifier to sense the potential of the floating diffusion and the floating diffusion is then reset by a reset FET, with respect to which the floating diffusion acts as source and a reset diffusion acts as drain.

Referring to FIG. 1, the floating diffusion 2 is connected to the charge-sensing amplifier, which is typically implemented by a MOSFET 4 operating in the source follower configuration and developing an output signal across a load resistor 6. The reset FET 16 has a gate RG for selectively connecting the floating diffusion 2 to the reset diffusion 18.

In general, it is desirable that the source follower MOSFET 4 should generate a low noise output signal. To maintain a low noise output, the conversion gain of the floating diffusion needs to be high. This is achieved by minimizing the capacitance of the floating diffusion and all its associated parasitics. Since the gate capacitance of the MOSFET contributes directly to the total parasitic capacitance, in order to generate a low noise output signal, the source follower MOSFET should be small. On the other hand, the bandwidth of the source follower is limited by the capacitance that the MOSFET can drive. In a typical implementation of the arrangement shown in FIG. 1, the load resistor 6 is off-chip and therefore there can be a rather large parasitic capacitance associated with the load resistor. Accordingly, although the output structure shown in FIG. 1 operates well for devices designed to function at a relatively low rate (less than 500 k pixels/sec.), it is not optimal for higher speed applications.

In order to operate at higher data rates, it is necessary to provide an output amplifier with a higher bandwidth. This can be accomplished by constructing a multistage source follower amplifier 8, as shown in FIG. 2. In order to maintain noise performance and high gain, it is important that the first stage MOSFET 10 be made small. Consequently, in order to operate at a high data rate, it is usual to employ a multistage source follower amplifier with the first stage being small and successive stages increasingly larger. For example, in one CCD that has been manufactured employing a two-stage amplifier, the first stage MOSFET 10 has l/w (length/width)=3/17 and the second stage MOSFET 12 has l/w=3/200.

Each source follower MOSFET in the multistage source follower amplifier requires its own load resistor. The load resistor 14 of the final MOSFET 12 may be off-chip and the loads for the first stage and any intermediate stages are typically provided by large MOSFETs (l/w=20/20) acting as constant current sources. This is a desirable configuration with respect to gain.

The current source MOSFETs serving as load transistors are fabricated on-chip, reducing the parasitic capacitance presented to the first stage and achieving a high bandwidth. Such loads are satisfactory for many applications where noise is not a severe limitation, but for low noise applications, such on-chip current sources are not acceptable because they are not only noisy but also tend to glow. The impact of glowing can be mitigated by placing the load transistor off-chip, but this will increase the parasitic capacitance and therefore reduce the bandwidth of the circuit. With proper design, it is possible to reduce the noise generated by the current source, but at the cost of speed.

An alternative to using load transistors as loads for the source follower MOSFETs is to employ on-chip resistors. For example, polysilicon resistors have been used in CMOS circuits. However, thin film resistors have better noise characteristics than polysilicon resistors.

A known method of fabricating a multiphase imaging CCD will now be described with reference to FIGS. 3–7.

FIG. 3 shows a silicon single crystal die 22 that has been processed in conventional fashion to form an active region 24 which extends partly into the die from the front side 26 thereof. The active region contains the imaging channels and the readout channel, but the channels are not shown in FIG. 3. The active region 24 is surrounded by a thick layer of field oxide 28. There are several apertures 30 (only two of which are shown in FIG. 3) in the field oxide near the periphery of the die. There is a thin layer of gate oxide (not shown in FIG. 3) over the die in the active region 24 and in the apertures 30.

Referring to FIG. 4, the clocking electrode structure includes three sets of polysilicon conductor strips $32_1$, $32_2$ and $32_3$, corresponding respectively to the three phases of the clock signal used to operate the CCD. The conductor strips $32_1$, $32_2$ and $32_3$ include respective gate electrodes $34_1$, $34_2$ and $34_3$ (FIG. 6) which extend over the thin oxide 36, crossing the channels that are influenced by the gate electrodes. Each conductor strip includes a gate extension 38 (FIG. 5) which extends some distance over the field oxide. The conductor strips 32 of the three sets are formed sequentially, by depositing and patterning three successive layers of polysilicon, and the three deposits of polysilicon are referred to as the first, second and third levels, in accordance with the order in which they are deposited. The first level polysilicon includes a bus 40 which connects the conductor strips $32_1$.

Referring to FIG. 5, discrete islands 42 of polysilicon extend into the apertures 30 in the field oxide.

When the polysilicon is initially deposited and patterned, it is non-conductive. Conductivity is imparted to the polysilicon conductor strips 32, the polysilicon bus 40 and the polysilicon islands 42 by doping with a donor dopant, such as phosphorus.

After the three levels of polysilicon have been deposited, patterned and doped, a layer 50 of reflow glass is deposited over the upper surface of the device and is patterned to expose various parts of the polysilicon conductor runs, including portions of the polysilicon bus 40, terminal portions of the second and third level polysilicon conductor strips $32_2$ and $32_3$ and the polysilicon islands 42. A blanket layer of interconnect metal is deposited over the reflow glass and is patterned to provide first, second and third buses $52_1$, $52_2$ and $52_3$. The first metal bus $52_1$ overlies the polysilicon bus 40 and is connected thereto by vias $54_1$, extending through apertures in the reflow glass. The second metal bus $52_2$ extends parallel to the first metal bus and is connected to the individual conductor strips $32_2$ of second level polysilicon by vias $54_2$ extending through apertures in the reflow glass. Similarly, the third metal bus $52_3$ extends parallel to the first metal bus and is connected to the conductor strips $32_3$ of third level polysilicon by vias $54_3$. Each of the metal buses 52 has a connection branch 56 extending outward to one of the polysilicon islands 42. Patterning of the interconnect metal may provide other interconnections than those mentioned above, such as the connection between the floating diffusion 2 (FIGS. 1 and 2) and the gate of the MOSFET 4 or 10.

An interface layer 58 is deposited over the front side of this structure and a support 60 is attached to the interface layer. The interface layer 58 accommodates differential thermal expansion and provides an adhesion layer between the silicon die 22 and the support 60. The silicon die is then thinned from its back side to a thickness in the range from about 10 to 20 μm. After thinning, the active region of the thinned die is masked and portions of the substrate outward of the active region are completely removed, leaving a silicon plateau 22' containing the active region surrounded by a plain of field oxide 28. In FIG. 5, the topography of the plateau and plain are inverted since, by convention, the circuit side of the structure is shown upward. The gate oxide is removed from the apertures 30 in the field oxide and aluminum is deposited over the plain of field oxide and is patterned to provide bonding pads including portions 62 which extend into the apertures 30 and make contact with the polysilicon islands 42. The aluminum bonding pads 62 are connected by wire bonding to external circuitry for driving the gate electrodes. See U.S. Pat. Nos. 4,923,825 and 6,072,204.

FIG. 7A is a partial top plan view of the die prior to deposit of the interconnect metal and shows five of the polysilicon islands 42. Further, FIG. 7A shows apertures 64 in the reflow glass 50 through which source and drain regions of the reset FET 16, the first stage MOSFET 10 and the second stage MOSFET 12 are exposed. The FETs 10, 12 and 16 have polysilicon gates 66, 68 and 70 respectively, which also are partially exposed through apertures in the reflow glass.

FIG. 7B shows the same part of the die after the interconnect metal has been deposited and patterned. Conductor runs of interconnect metal connect the gate and drain of the reset FET 16 to respective polysilicon islands $42_1$, and $42_2$ and connect the source of the reset FET to the gate 66 of the MOSFET 10. Similarly, interconnect metal connects the drain of the MOSFET 10 to an island $42_3$ and connects the source of the MOSFET 10 to the gate of the MOSFET 12. Interconnect metal (not shown) connects the source of the MOSFET 10 to the load for that MOSFET. Further, interconnect metal connects the drain and source of the MOSFET 12 to the polysilicon island $42_4$ and $42_5$. When the device is completed, the polysilicon islands $42_1$ and $42_2$ are connected through the respective bond pads 62 and bond wires to the reset gate control signal and the reset drain reference potential level. The polysilicon islands $42_3$ and $42_4$ are connected to the VDD reference potential level and the island $42_5$ is connected to an output terminal of the device.

In one practical implementation of the process described with reference to FIGS. 3–7, the support 60 is made of borosilicate glass. The process by which the borosilicate glass support is formed involves high temperature steps and consequently the interconnect metal must be a refractory metal rather than the aluminum that is frequently used to provide conductive traces in semiconductor device fabrication. Other techniques for supporting the silicon die during thinning, without requiring high temperature process steps, have also been proposed. In the event that the process steps are below about 450° C., the interconnect metal that is used to provide the buses and other connections may be aluminum.

Aluminum is reactive with silicon. Therefore, when aluminum is used as interconnect metal to provide a connection to a silicon contact, it is desirable that a thin layer of barrier conductor be provided between the interconnect metal and the silicon contact to prevent the reaction that would otherwise take place at the junction between the aluminum interconnect metal and the silicon single crystal, since this reaction may damage the silicon crystal and impair the performance of the device. The barrier conductor may be, for example, doped silicon, titanium nitride or titanium/tungsten. Some of the materials that are suitable for use as the barrier conductor have a high resistivity compared with aluminum. Conventionally, the barrier conductor is patterned at the same time as the aluminum so that the barrier conductor and the aluminum are essentially coextensive.

Copper may be used as an interconnect metal in the event that the interconnect metal is not required to withstand high temperatures. It is necessary to provide a conductive barrier layer between copper interconnect metal and the silicon crystal.

All known electrically-conductive materials have finite resistivity at and above normal room temperature (about 18° C.), but for some metal structures the electrical resistance is so low that it is considered negligible for most circuit design purposes. Most electrical circuits include at least one circuit element that provides a specific and defined function as a resistor in the electrical circuit. In current integrated circuit design practice, a circuit element would have to have an electrical resistance of at least about 10 ohm in order to be considered to be a functional resistor.

SUMMARY OF THE INVENTION

In accordance with a first aspect of the invention there is provided a method of fabricating a semiconductor device, comprising (a) providing a body of semiconductor material having a front side and a back side, (b) forming an insulating layer over the front side of the body of semiconductor material, the insulating layer having a back side confronting the front side of the body of semiconductor material and having an opposite front side, (c) depositing a layer of high resistivity material over the front side of the insulating layer, (d) patterning a portion of the layer of high resistivity material to form a long and narrow trace, and (e) attaching a support member to the front side of the insulating layer.

In accordance with a second aspect of the invention there is provided a method of fabricating a semiconductor device, including providing a body of semiconductor material having a front side and a back side, forming an insulating layer over the front side of the body of semiconductor material, the insulating layer having a back side confronting the front side of the body of semiconductor material and having an opposite front side, and the insulating layer being formed with an aperture through which the semiconductor material is exposed, depositing a layer of high resistivity material over the front side of the insulating layer, the layer of high resistivity material contacting the semiconductor material exposed through the aperture in the insulating layer, and patterning the layer of high resistivity material to form a functional resistor connected to the semiconductor material through the aperture in the insulating layer.

In accordance with a third aspect of the invention there is provide a method of fabricating a semiconductor device, comprising (a) providing a body of semiconductor material having a front side and a back side, (b) forming an insulating layer over the front side of the body of semiconductor material, the insulating layer having a back side confronting the front side of the body of semiconductor material and having an opposite front side, (c) depositing a layer of high resistivity material over the front side of the insulating layer, (d) depositing a layer of low resistivity material over the layer of high resistivity material, (e) patterning the layer of low resistivity material to form two discrete terminal portions, and (f) patterning the layer of high resistivity material to form a functional resistor having two terminals located between the body of semiconductor material and said two terminal portions respectively of the layer of low resistivity material.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

When the blanket layer of refractory interconnect metal is deposited over the front side of the device, it makes contact with the polysilicon conductors and silicon contacts that are exposed through the reflow glass, including the source of the first stage MOSFET and the islands 42 of polysilicon at the periphery of the die.

Figure 1:
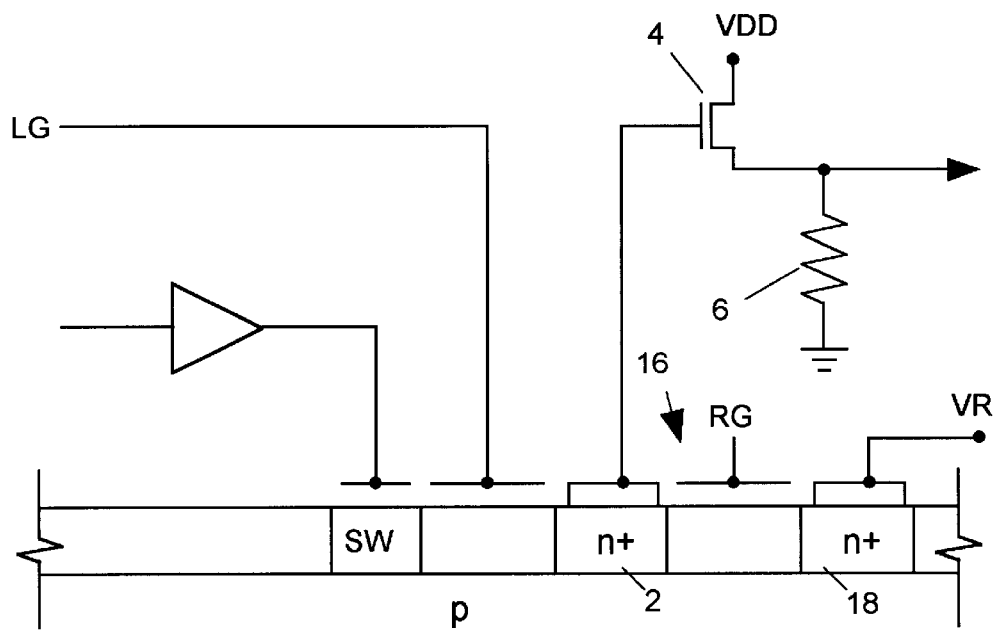
FIG. 1 is a schematic partial sectional view of the readout section of a CCD in accordance with the prior art.
Figure 2:
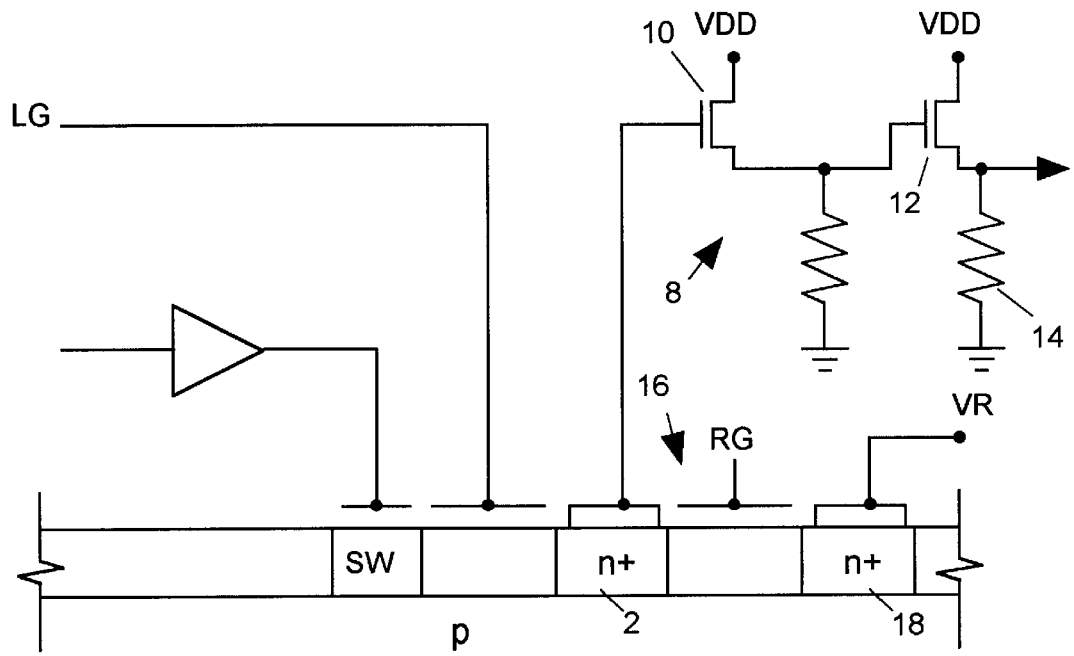
FIG. 2 is a similar view of a second CCD in accordance with the prior art.
Figure 3:
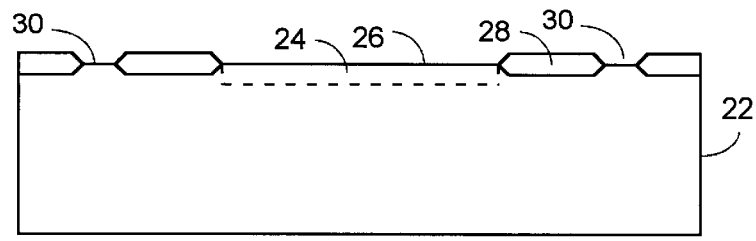
FIG. 3 is a part sectional view of a CCD in accordance with the prior art partway through fabrication.
Figure 4:
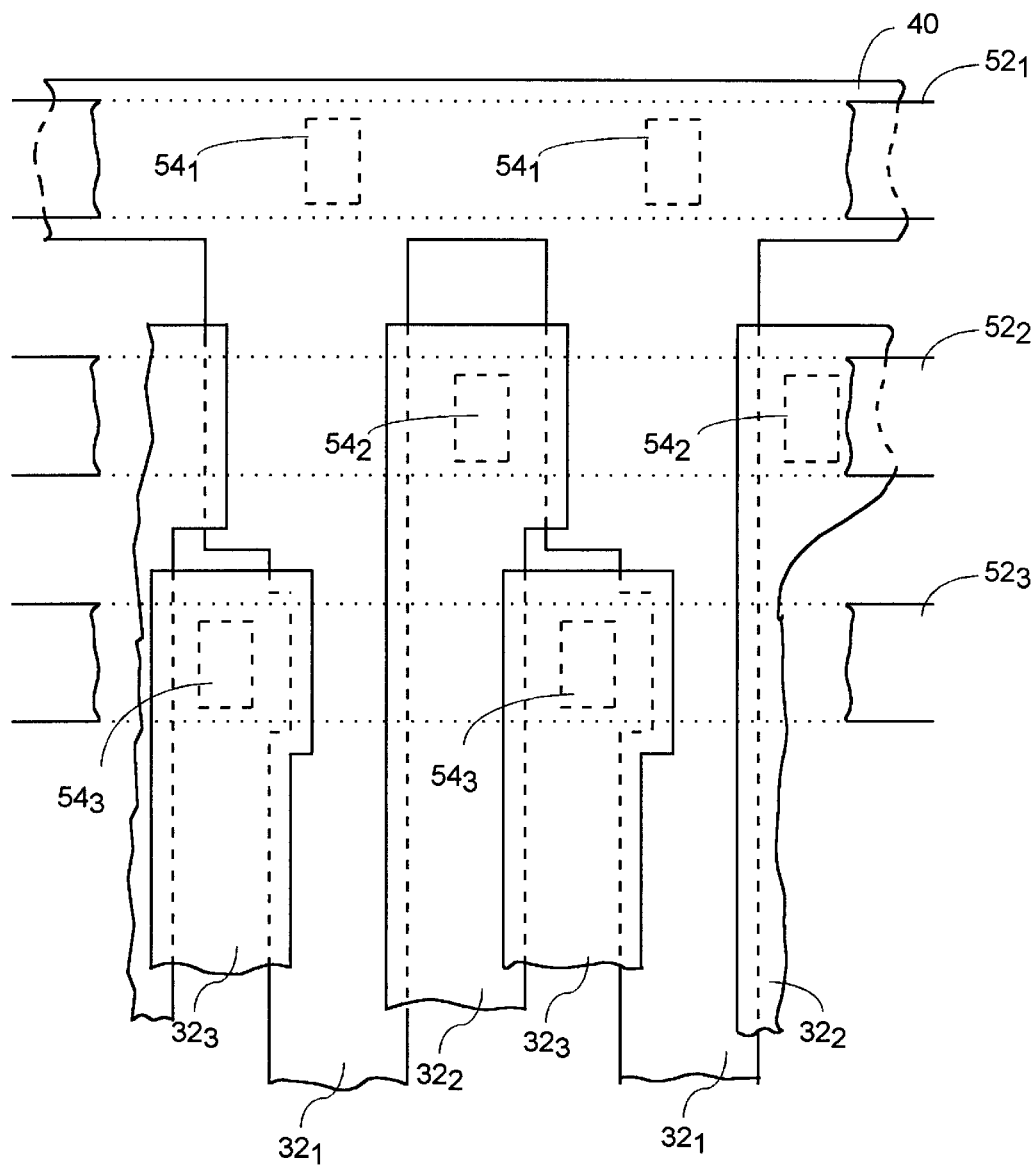
FIG. 4 is a top plan view of the CCD in accordance with the prior art at a later stage in fabrication in order to illustrate the arrangement of gate electrodes.
Figure 5:
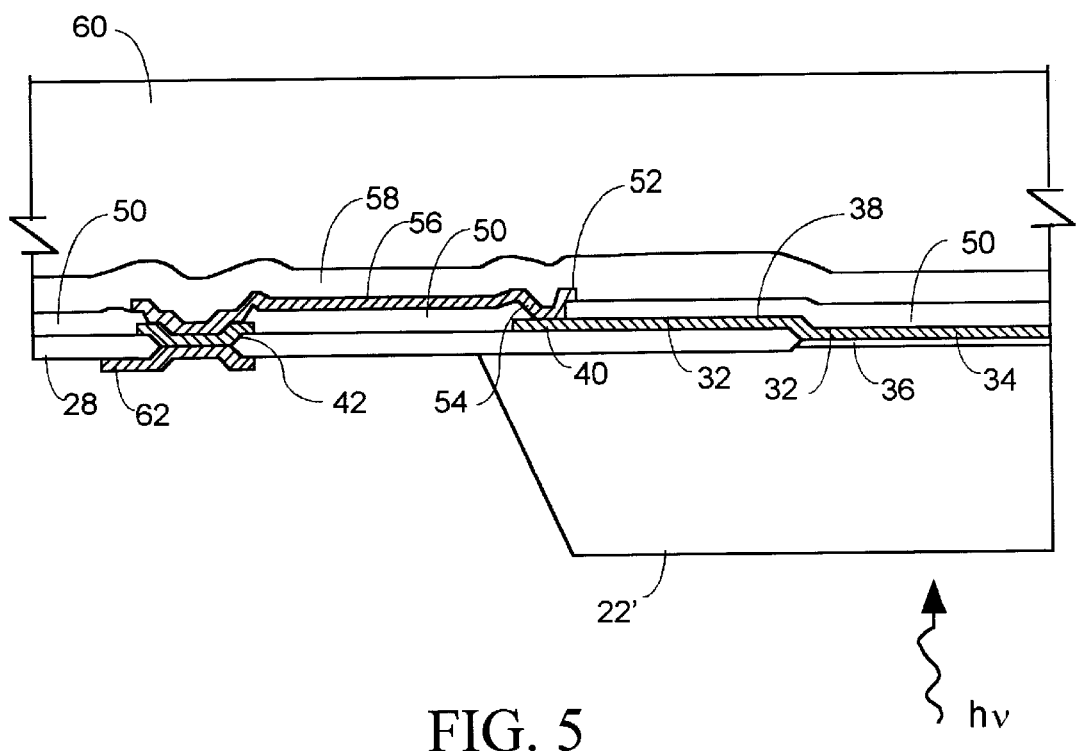
FIG. 5 is a sectional view of the completed CCD.
Figure 6:
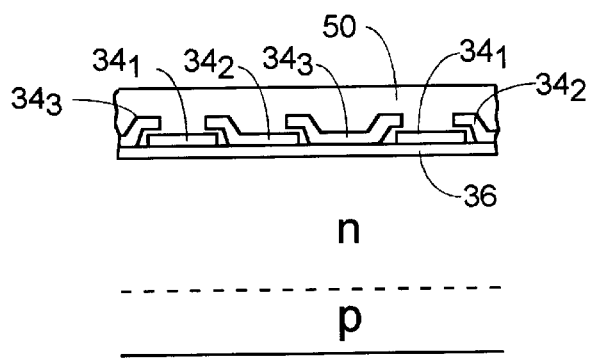
FIG. 6 is a further sectional view taken at right angles to FIG. 5, FIGS. 7A and 7B, referred to collectively as FIG. 7, are respectively a top plan view of the CCD shown in FIGS. 3–5 prior to deposit of the interconnect metal, and a similar view after deposit and patterning of the interconnect metal.
Figure 7A:
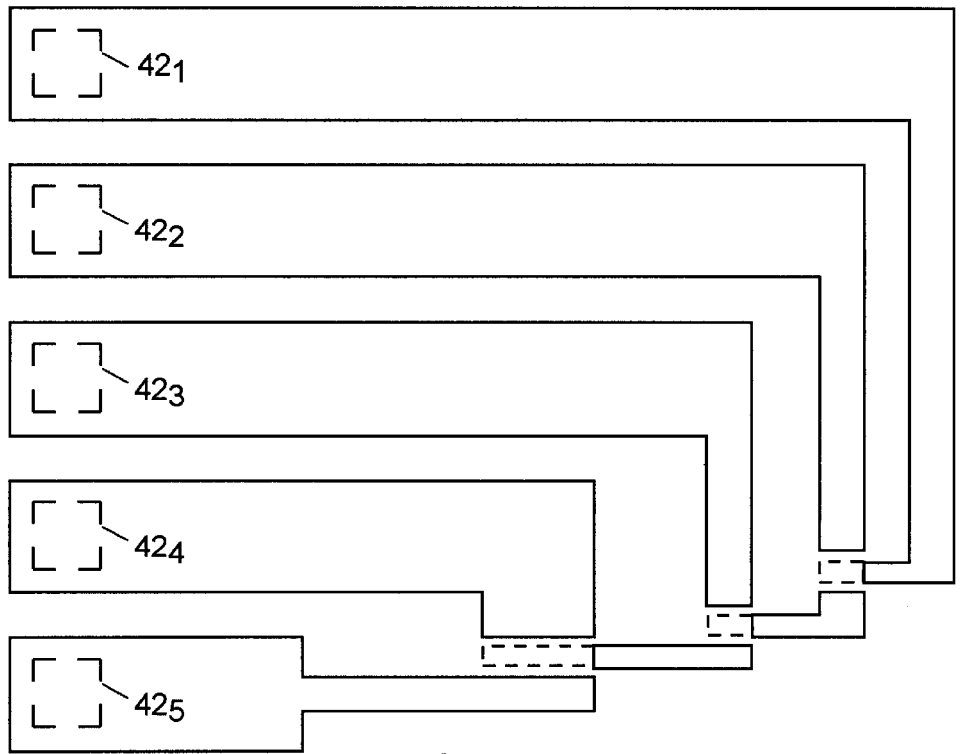
Figure 7A:
Figure 7A:
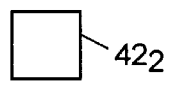
Figure 7A:
Figure 7A:
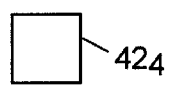
Figure 7A:
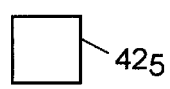
Figure 7A:
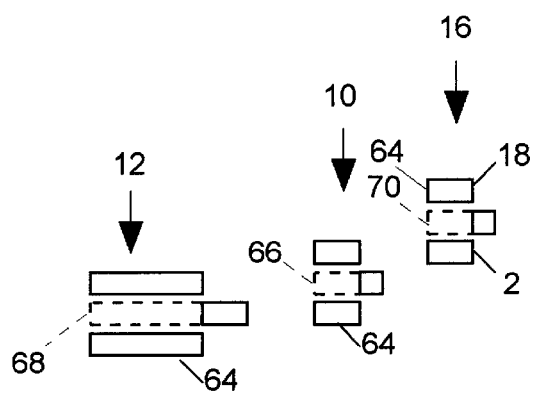
Figures 8, 9:
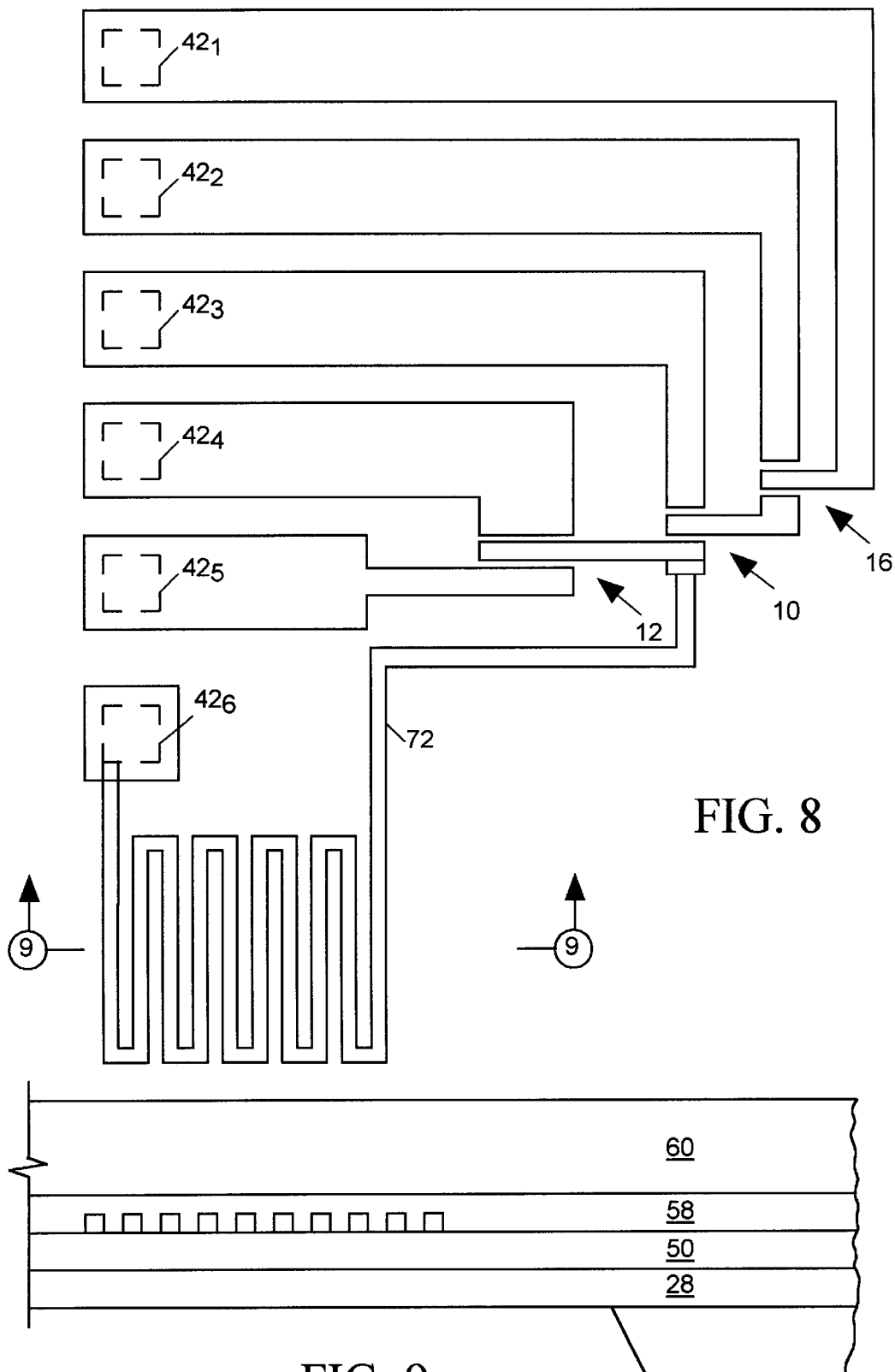
FIG. 8 is a view similar to FIG. 7B of a CCD that has been fabricated in accordance with the present invention.
FIG. 9 is a sectional view taken on the line 9—9 of FIG. 8.

Referring to FIG. 8, the refractory metal layer is patterned to form, in addition to the connections described with reference to FIG. 7B, a narrow strip 72 at the periphery of the die and having one end in electrically-conductive contact with the source of the first stage MOSFET 10 and its opposite end in electrically-conductive contact with a polysilicon island $42_6$. The strip 72 is of meandering or serpentine form and therefore its length is much greater than the distance between the source of the first stage MOSFET and the polysilicon island $42_6$. For ease of illustration, FIGS. 8 and 9 illustrate only ten conductor segments but in a practical implementation of the invention, the meandering path can be composed of substantially more than ten segments.

After the refractory metal layer has been patterned, the wafer is processed in the manner described with reference to FIGS. 3–7. The aluminum that is deposited over the back side of the field oxide forms a bond pad connected to the polysilicon island $42_6$. The bond pad that is connected to the polysilicon island $42_6$ can be connected to a reference potential level which may, but need not, be ground.

It will be understood that the resistance of the strip 72 depends on the sheet resistivity of the refractory metal and the width and length of the strip. For example, appropriate choices of thickness and material allow the strip 72 to have sufficient resistance to serve as a load resistor for the first stage MOSFET 10. Since the resistor is a thin film resistor, it has low noise. Because the major part of the meandering path is outside the boundary of the silicon plateau, the parasitic capacitance associated with the resistor is very small.

Because refractory metals, such as titanium/tungsten and nickel/chromium, have a high resistivity relative to many other metals, such as aluminum, it is possible to form a functional resistor by processing the refractory metal layer using conventional photolithographic processing techniques to provide a narrow conductor run that is confined to a rather small area. The resistivity of conductive materials that are conventionally used for interconnection in semiconductor integrated circuits fabrication, such as aluminum and copper, is so low that it would not be possible to make a functional resistor between the source of the first stage MOSFET and the polysilicon island $42_6$ using a conductor run of one of those materials of the minimum width that can be achieved using conventional integrated circuit fabrication techniques and confined to the available area of the front side of reflow glass layer.

Figure 10A:
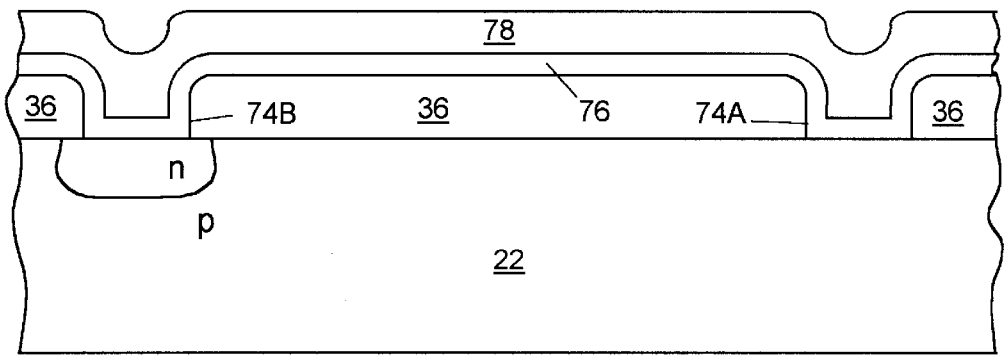
FIG. 10A is a sectional view of a CCD that has been partially fabricated by a second method in accordance with the invention after deposit of the interconnect metal.
Figure 10B:
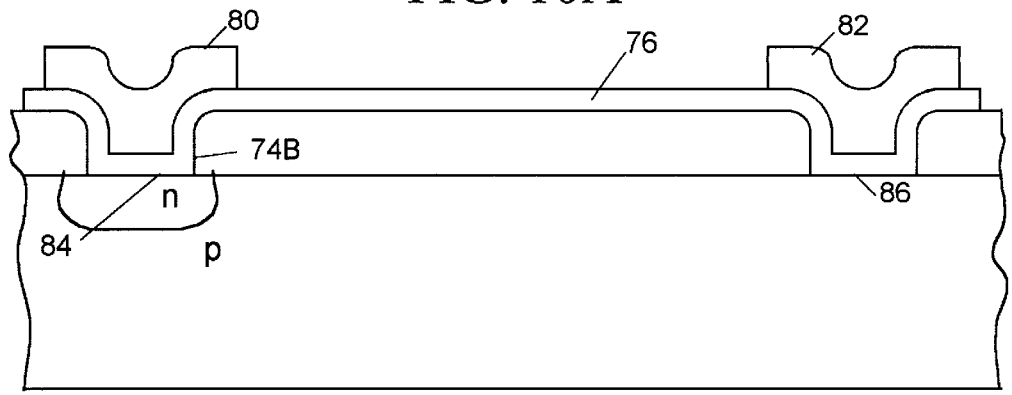
FIG. 10B is a view similar to FIG. 10A after patterning of the interconnect metal.

Referring to FIG. 10A, a thin oxide layer 36 over the front side of a silicon die 22 is formed with two openings 74. The p-type substrate of the die is exposed through the opening 74A and an n-type implant is exposed through the opening 74B. A thin layer 76 of barrier conductor is deposited over the oxide layer and makes contact to the silicon die through the openings in the oxide layer. A thick layer 78 of interconnect metal, such as aluminum, is then deposited over the barrier conductor layer and is patterned in a first photolithographic operation using an etchant that does not attack the barrier conductor to define two aluminum conductor runs 80 and 82 (FIG. 10B) which are connected to the die 22 at silicon contacts 84 and 86 respectively. The conductor runs 80 and 82 are isolated from other portions of the aluminum layer so that there is no conductive path through the aluminum layer between the two silicon contacts. In a second photolithographic operation, the barrier conductor layer 76 is patterned to provide a meandering conductive path between the two silicon contacts over the area exposed by removal of the aluminum layer. The barrier conductor thus provides a functional thin film resistor 88 between the two silicon contacts. The resistor can be laser trimmed to the desired resistance value if a precision resistor is required or left as is if the tolerances allow.

Figure 11:
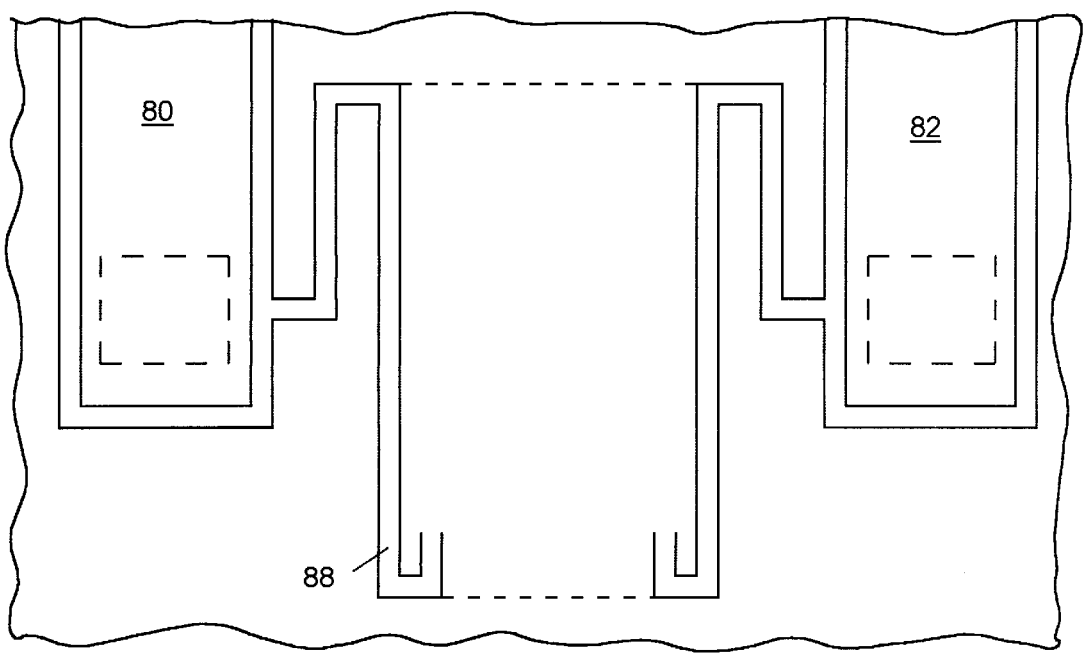
FIG. 11 is a top plan view of the structure shown in FIG. 10B.

In a modification of the process described with reference to FIGS. 10 and 11, the barrier conductor is patterned to form the functional resistor before the interconnect metal is deposited and patterned.

The silicon contacts 84 and 86 and the pn junction between the n-type implant and the p-type substrate of the die 22 form a diode having its anode and cathode connected to the conductor runs 80 and 82 respectively and the resistor is connected in parallel with the diode between the conductor runs 80 and 82. It will, however, be appreciated that other circuit elements or structures could be integrated in the die 22 and connected by the thin film resistor. For example, one of the silicon contacts could be connected to the source of a MOSFET. Further, it is not essential that the terminals of the resistor be silicon contacts since the layer 76 may be patterned to provide a resistor connected to a polysilicon pad that is connected to a circuit element incorporated in the die 22.

The method described with reference to FIGS. 10 and 11 has general application to silicon integrated circuits employing aluminum interconnect metal, but is not applicable to fabrication of a device where high temperature processing steps are required after the interconnect metal has been deposited, such as a thinned CCD employing a borosilicate glass support. However, as suggested above, if high temperature processing steps are not required, the use of aluminum metallization in the process described with reference to FIGS. 10 and 11 does not preclude application of this method to fabrication of a thinned CCD. In particular, it is possible to employ a second silicon wafer as a support for the CCD wafer during the thinning process. In accordance with this method, a layer of bonding material is deposited over the front surface of the structure after the barrier conductor has been patterned and the silicon support wafer is placed over the layer of bonding material. The sandwich structure composed of the active wafer, the support wafer and the layer of frit therebetween is subjected to conditions such that the bonding material undergoes a change of state and bonds the two wafers together. The bonding material is selected so that it changes states without need for elevation to a temperature above about 400° C., which is low enough that the aluminum interconnect metal is not damaged. The active wafer can then be thinned while being supported by the support wafer. The bonding material may be, for example, glass frit, in which case change of state is effected by heating to a temperature such that the frit fuses and then allowing the sandwich structure to cool. Alternatively, the bonding material may be an adhesive, such as an epoxy adhesive, that cures through lapse of time and/or heating to a temperature well below 400° C.

It will be appreciated that the invention is not restricted to the particular embodiments that have been described, and that variations may be made therein without departing from the scope of the invention as defined in the appended claims and equivalents thereof. For example, although the resistor that is formed by the strip 72 shown in FIG. 8 is a load resistor, by suitable patterning of the refractory metal layer, it is possible to provide a resistor that serves another function, such as influencing gain. Further, although FIGS. 10 and 11 have been described with reference to use of aluminum as interconnect metal, the process is also applicable to use of other metals, such as copper, that require a barrier conductor as the interconnect metal. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. A method of fabricating a semiconductor device, comprising:

(a) providing a body of semiconductor material having a front side and a back side, (b) forming an insulating layer over the front side of the body of semiconductor material, the insulating layer having a back side confronting the front side of the body of semiconductor material and having an opposite front side, (c) depositing a layer of high resistivity material over the front side of the insulating layer, (d) patterning a portion of the layer of high resistivity material to form a long and narrow trace having a resistance of at least about 10 ohms, and (e) attaching a support member to the front side of the insulating layer.

2. A method according to claim 1, wherein the front side of the insulating layer has first and second distinct areas and the back side has corresponding first and second distinct areas, and the patterning of step (d) forms a long and narrow trace substantially confined to the first area of the front side of the insulating layer.

3. A method according to claim 2, further comprising:
(f) removing the semiconductor material from the first area of the back side of the insulating layer, leaving a plateau of semiconductor material over the second area of the back side of the insulating layer.

4. A method according to claim 1, wherein the high resistivity material that is deposited in step (c) is a refractory metal.

5. A method of fabricating a semiconductor device, including:
providing a body of semiconductor material having a front side and a back side,
forming an insulating layer over the front side of the body of semiconductor material, the insulating layer having a back side confronting the front side of the body of semiconductor material and having an opposite front side, and the insulating layer being formed with an aperture through which the semiconductor material is exposed,
depositing a layer of high resistivity material over the front side of the insulating layer, the layer of high resistivity material contacting the semiconductor material exposed through the aperture in the insulating layer, and
patterning the layer of high resistivity material to form a functional resistor connected to the semiconductor material through the aperture in the insulating layer and having a resistance of at least about 10 ohms.

6. A method according to claim 5, wherein an island of conductive material is exposed at the front side of the insulating layer and the functional resistor has a terminal connected to the island of conductive material.

7. A method according to claim 6, wherein the insulating layer is composed of a first layer over the front side of the body of semiconductor material and a second layer over the first layer, and the method of forming the insulating layer includes depositing the first layer over the front side of the body of semiconductor material, depositing a layer of conductive material over the front side of the first layer, patterning the layer of conductive material to form said island, depositing the second layer over the front side of the first layer and over the island of conductive material, and forming an aperture in the second layer through which the island of conductive material is exposed.

8. A method of fabricating a semiconductor device, comprising:
(a) providing a body of semiconductor material having a front side and a back side,
(b) forming an insulating layer over the front side of the body of semiconductor material, the insulating layer having a back side confronting the front side of the body of semiconductor material and having an opposite front side,
(c) depositing a layer of high resistivity material over the front side of the insulating layer,
(d) depositing a layer of low resistivity material over the layer of high resistivity material,
(e) patterning the layer of low resistivity material to form two discrete terminal portions, and
(f) patterning the layer of high resistivity material to form a functional resistor having two terminals located between the body of semiconductor material and said two terminal portions respectively of the layer of low resistivity material.

9. A method according to claim 8, wherein the insulating layer is formed with an aperture through which the semiconductor material is exposed, the layer of high resistivity material contacts the semiconductor material exposed through the aperture in the insulating layer, one of the terminal portions of the layer of low resistivity material is located at least partially in the aperture, and a terminal of the functional resistor formed in step (f) is connected to the semiconductor material through the aperture.

10. A method according to claim 9, wherein the semiconductor material provided in step (a) is silicon, the high resistivity material deposited in step (c) is a barrier conductor and the low resistivity material deposited in step (d) is a metal that is reactive with silicon.

11. A method according to claim 8, wherein the insulating layer is formed with two apertures through which the semiconductor material is exposed, the layer of high resistivity material contacts the semiconductor material exposed through the apertures in the insulating layer, the terminal portions of the layer of low resistivity material are located at least partially in the apertures respectively, and the terminals of the functional resistor formed in step (f) are connected to the semiconductor material through the apertures.

12. A method according to claim 8, including performing step (e) before step (d).

13. A method according to claim 1, wherein the long and narrow trace is of serpentine configuration.

14. A method according to claim 5, wherein the layer of high resistivity material is patterned to form a long and narrow trace of serpentine configuration.

* * * * *